(12) United States Patent  
Jung et al.

(10) Patent No.: US 7,932,576 B2  
(45) Date of Patent: Apr. 26, 2011

(54) TRANSPARENT CONDUCTIVE LAYER AND METHOD OF MANUFACTURING THE SAME

(75) Inventors: Seung-Jae Jung, Seoul (KR); Yuk-Hyun Nam, Goyang-si (KR); Czang-Ho Lee, Suwon-si (KR); Myung-Hun Shin, Suwon-si (KR); Min-Seok Oh, Yongin-si (KR); Byoung-Kyu Lee, Suwon-si (KR); Mi-Hwa Lim, Chungcheongnam-do (KR); Joon-Young Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 103 days.

(21) Appl. No.: 12/413,979

(22) Filed: Mar. 30, 2009

(65) Prior Publication Data

US 2010/0001359 A1    Jan. 7, 2010

(30) Foreign Application Priority Data

Jul. 4, 2008    (KR) .................. 10-2008-0065078

(51) Int. Cl.  
*H01L 31/075* (2006.01)

(52) U.S. Cl. ................. 257/458; 257/4; 257/43  
(58) Field of Classification Search .......... 257/458, 257/4, 43  
See application file for complete search history.

(56) References Cited

FOREIGN PATENT DOCUMENTS

| JP | 06-196734 | 7/1994 |
|----|-----------|--------|
| JP | 09-139515 | 5/1997 |
| JP | 11-189436 | 7/1999 |
| JP | 2000-058890 | 2/2000 |
| JP | 2004-214541 | 7/2004 |
| KR | 1020060003277 A | 1/2006 |
| KR | 100699072 B | 3/2007 |

*Primary Examiner* — Long Pham  
(74) *Attorney, Agent, or Firm* — Cantor Colburn LLP

(57) ABSTRACT

A transparent conductive layer includes a substrate, a first conductive layer disposed on the substrate, and a second conductive layer disposed on the first conductive layer, wherein the second conductive layer comprises a textured surface and an opening which exposes the first conductive layer, wherein the opening comprises a diameter of about 1 micrometer to about 3 micrometers. Also disclosed is a method of manufacturing the transparent conductive layer and a photoelectric device.

11 Claims, 5 Drawing Sheets

TRANSPARENT CONDUCTIVE LAYER AND METHOD OF MANUFACTURING THE SAME

This application claims priority to Korean Patent Application No. 10-2008-0065078, filed on Jul. 4, 2008, and all the benefits accruing therefrom under 35 U.S.C. §119, the contents of which in its entirety are herein incorporated by reference.

BACKGROUND OF THE INVENTION (a) Field of the Invention

This disclosure relates to a transparent conductive layer and a method of manufacturing the same.

(b) Description of the Related Art

A photoelectric device, such as a solar cell, converts light energy into electric energy. Types of photoelectric devices can be differentiated by the metals used therein for the active layers. Thus a solar cell converts solar energy into electric energy, and generates electricity using at least two kinds of semiconductors, a P-type semiconductor, and an N-type semiconductor.

Classes of solar cells include crystalline silicon solar cells, which are commercially available, thin film solar cells, which are based on low cost substrates, and composite solar cells, which can be a crystalline silicon-type solar cell or a thin film-type solar cell.

Crystalline silicon solar cells, in which slices of silicon ingots are used as substrates, are classified as monocrystalline solar cells or polycrystalline solar cells, depending upon the silicon processing method. A monocrystalline silicon solar cell has a PN junction structure including an N-type semiconductor, which includes a pentavalent element such as phosphorous, arsenic, or antimony doped into the silicon, and a P-type semiconductor, which includes a trivalent element, such as boron or gallium doped into the silicon. The resulting structure is roughly the same as that of a diode.

A thin film solar cell can be formed by disposing a film on a substrate, which includes glass or plastic. In commercially available thin film solar cells, the diffusion distance of carriers is very short due to the characteristics of the thin film, as compared to crystalline silicon solar cells. Also, if the thin film solar cell is fabricated only with a PN junction structure, the collection efficiency of light generated electron-hole pairs is low. Therefore, a thin film solar cell can include a PIN structure wherein an intrinsic semiconductor-based light-absorbing layer with a high light absorption is interposed between a P-type semiconductor and an N-type semiconductor. Commercially available thin film solar cells include a structure where a front transparent conductive layer, a PIN layer, and a rear reflective electrode layer are sequentially disposed on a substrate. In this structure, the light-absorbing layer is depleted due to the overlying P and the underlying N layers, which include a high doping concentration, so that an electric field is generated therein. As a result, when light, such as sunlight, generates a carrier in the light-absorbing layer, an electron is collected at the N layer and a hole is collected at the P layer by way of drift of an internal electric field, thereby generating an electric current.

In a solar cell, the light-absorbing layer includes a multi-component compound such a Si, GaAs, CdTe, or $CuInSe_2$. Because silicon is an indirect transition material, the light absorption coefficient of silicon is very low compared to that of other compounds, such as CdTe or $CuInSe_2$. For this reason, where the light-absorbing layer is disposed as a thin film including a thickness of several microns or less, it does not absorb all of the incident light, and therefore current density loss occurs due to transmitted light.

A textured transparent conductive layer may be used to enhance the efficiency of the solar cell. A textured transparent conductive layer can increase a distance light must travel because of light scattering, thus improving light absorption and significantly enhancing an efficiency of the solar cell. However, a current textured transparent conductive layer preferentially scatters short wavelength light, thus scatters long wavelength light less.

Accordingly, an improved light scattering or trapping technique including a front transparent conductive layer and a rear reflective electrode, which can scatter loner wavelength light, would be desirable to improve the efficiency of a solar cell.

BRIEF SUMMARY OF THE INVENTION

The disclosed transparent conductive layer, and method of manufacturing the same, increases light scattering in a long wavelength region, enhances a light efficiency, and includes a first conductive layer and a second conductive layer, which can be sequentially disposed on a substrate, wherein the second conductive layer includes an opening, which exposes the first conductive layer, and a top surface of the second conductive layer is a textured surface.

Thus the above described and other drawbacks are alleviated by a transparent conductive layer including a substrate; a first conductive layer disposed on the substrate; and a second conductive layer disposed on the first conductive layer, wherein the second conductive layer includes a textured surface and an opening which exposes the first conductive layer, wherein the opening includes a diameter between about 1 micrometer ("µm") to about 3 µm.

The first conductive layer may be formed with $In_2O_3$, and the second conductive layer may be formed with a ZnO-based material.

The first conductive layer may be formed with $In_2O_3$ and equal to or less than 15 weight percent ("wt. %") of at least one of $SnO_x$, $ZnO_x$, $WO_x$, $TiO_x$, and a combination including at least one of the foregoing oxides, based on the total weight of the first conductive layer.

The second conductive layer may be formed with ZnO and equal to or less than 10 wt. % of at least one of $AlO_x$, $GaO_x$, and a combination including at least one of the foregoing oxides, based on the total weight of the second conductive layer.

The first conductive layer includes a thickness of between about 500 angstroms ("Å") to about 3000 Å.

The second conductive layer includes a thickness of about 500 Å to about 10,000 Å.

Also disclosed is a method of manufacturing a transparent conductive layer, the method includes disposing a first conductive layer and a second conductive layer on a substrate, wherein the first conductive layer and the second conductive layer are disposed sequentially, etching the second conductive layer to form a textured surface on the second conductive layer, and etching the second conductive layer to form an opening which exposes a top surface of the first conductive layer.

The first conductive layer may be formed with $In_2O_3$, and the second conductive layer may be formed with a ZnO-based material.

Etching of the second conductive layer further comprises using an etching solution, which has an etching selection ratio of equal to or greater than 10:1 of the second conductive layer to the first conductive layer.

The etching solution includes at least one acid selected from the group consisting of nitric acid, hydrochloric acid, sulfuric acid, acetic acid, and a combination including at least one of the foregoing acids.

The opening which exposes the top surface of the first conductive layer includes a diameter between about 1 μm to about 3 μm.

Also disclosed is a photoelectric device including a substrate, a first conductive layer disposed on the substrate, a second conductive layer disposed on the first conductive layer, the second conductive layer including an opening which exposes the first conductive layer; a semiconductor layer disposed on the second conductive layer; and a rear electrode disposed on the semiconductor layer, wherein a top surface of the second conductive layer includes a textured surface, and the opening includes a diameter between about 1 μm to about 3 μm.

The first conductive layer may be formed with $In_2O_3$, and the second conductive layer may be formed with a ZnO-based material.

The semiconductor layer includes a lower layer and an upper layer, wherein the lower layer includes a P layer, an I layer, and an N layer, which are sequentially disposed on the second conductive layer, and wherein the upper layer includes a P layer, an I layer, and an N layer which are sequentially disposed on the lower layer, wherein the I layer of the lower layer may be formed with amorphous silicon ("a-Si"), and the I layer of the upper layer may be formed with micro-crystalline silicon ("μc-Si").

The semiconductor layer includes a multi-layered structure including a plurality of sub-structures, wherein each sub-structure includes a P layer, an I layer, and an N layer which are sequentially disposed.

The semiconductor layer includes a P layer, an I layer, and an N layer, which are sequentially disposed on the second conductive layer.

In an exemplary embodiment, etching of an $In_2O_3$-based first conductive layer can be substantially reduced or prevented, a selected sheet resistance provided, and a ZnO-based second conductive layer can include a dual texture structure to thereby increase light scattering in a long wavelength region. Consequently, the light efficiency of a photoelectric device can be improved.

These and other features, aspects, and advantages of the disclosed embodiments will become better understood with reference to the following description and appended claims.

BRIEF DESCRIPTION OF THE DRAWINGS

The disclosed subject matter is particularly pointed out and distinctly claimed in the claims at the conclusion of the specification. The foregoing and other objects, features, and advantages of the disclosed embodiments are apparent from the following detailed description taken in conjunction with the accompanying drawings in which:

Figure 1:
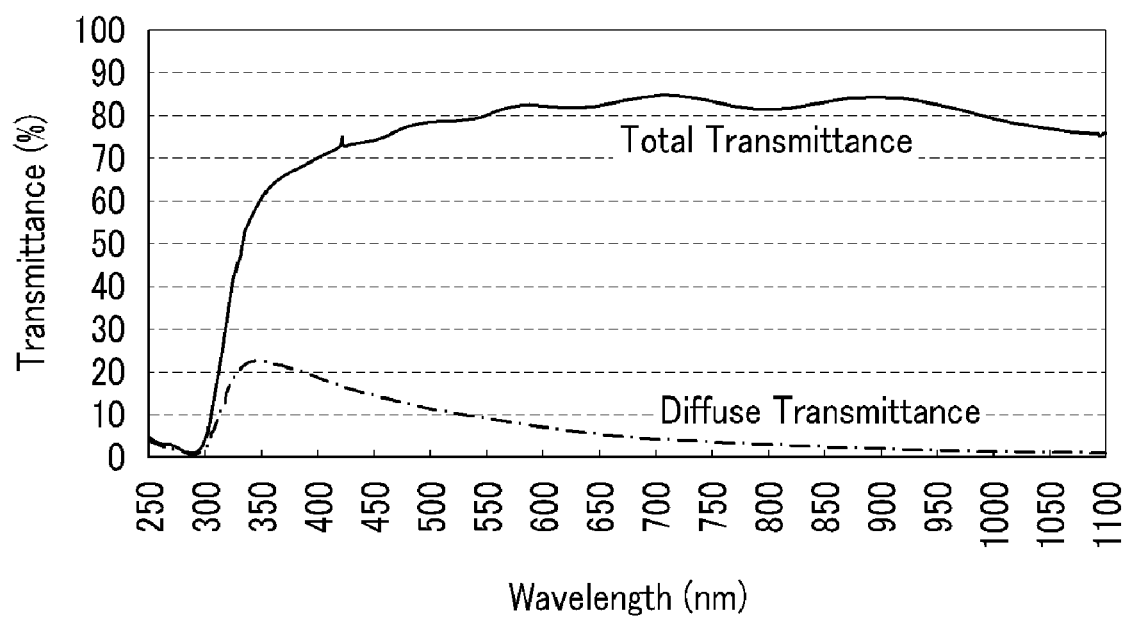
FIG. 1 is a graph illustrating a transmittance of an exemplary embodiment of a transparent conductive layer, which comprises a textured surface.

The detailed description explains the exemplary embodiments, together with aspects, advantages and features, by way of example with reference to the drawings.

DETAILED DESCRIPTION OF THE INVENTION

The exemplary embodiments are described more fully hereinafter with reference to the accompanying drawings, in which exemplary embodiments are shown. As those skilled in the art would realize, the described embodiments may be modified in various ways, all without departing from the spirit or scope of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

The terms "the", "a" and "an" do not denote a limitation of quantity, but rather denote the presence of at least one of the referenced item.

A diffuse transmittance can be defined as the degree by which a direction of light progression is varied when light passes through a textured surface, and a parallel transmittance can be defined as the degree by which a direction of light progression is not varied when light passes through a textured surface. A total transmittance is a sum of the diffuse transmittance and the parallel transmittance. A textured surface is a surface which is uneven or rugged, for example as a result of etching, thereby increasing the absorption of light.

FIG. 1 is a graph illustrating a transmittance of an exemplary embodiment of a transparent conductive layer comprising a textured surface.

Methods of forming a transparent conductive layer comprising a textured surface include a method which comprises disposing $SnO_2$:F, or the like, onto a target, the method comprising, for example atmospheric pressure chemical vapor deposition, and a method which comprises disposing ZnO:B, or the like, onto a target by a method comprising, for example, low pressure chemical vapor deposition. In an embodiment, where a ZnO-based thin film is disposed by a method which comprises sputtering, or the like, and a surface of the thin film is etched using an aqueous HCl solution having a concentration between about 0.1 weight percent ("wt %") to about 5 wt %, specifically about 0.5 wt % to about 1 wt %, more specifically about 0.75 wt %, a textured surface can be disposed depending upon a fine structure of the thin film, an etching time, or the like. FIG. 1 illustrates that a transparent conductive layer comprising a textured surface can exhibit high diffuse transmittance in a short wavelength region, but the diffuse transmittance of the transparent conductive layer can be lower at longer wavelengths. As is also shown in FIG. 1, amorphous silicon ("a-Si") has an absorption region of about 350 nanometers ("nm") to about 700 nm, therefore it would be desirable to provide a light scattering or diffusion effect with a textured transparent conductive layer to extend the diffuse transmittance to longer wavelengths. By contrast, the absorption region of micro-crystalline silicon ("μc-Si") is about 700 nm to about 1200 nm, thus providing the desired diffusion effect is more difficult for μc-Si than a-Si because μc-Si absorbs occurs at longer wavelengths than a-Si. In an embodiment, a feature size of the textured surface is between about 0.1 micrometers (μm) to about 10 μm, specifically between about 0.3 μm to about 7 μm, more specifically equal to or greater than about 1 μm, and such features can diffuse long wavelength light. However it is difficult with commercially available processes to dispose a textured surface comprising this feature size. The feature size can be defined as a diameter of a cone-shaped crater disposed by a method of disposing a textured surface.

Figure 2:
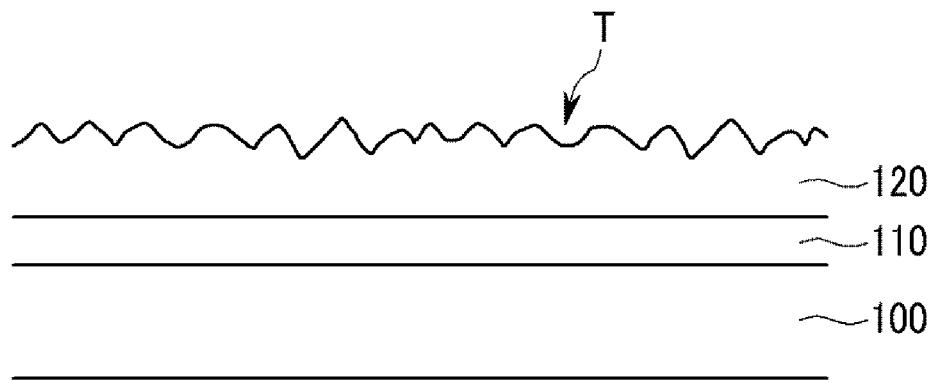
FIG. 2 and FIG. 3 are cross-sectional views of an exemplary embodiment of a transparent conductive layer, illustrating a method of manufacturing the same.
Figure 3:
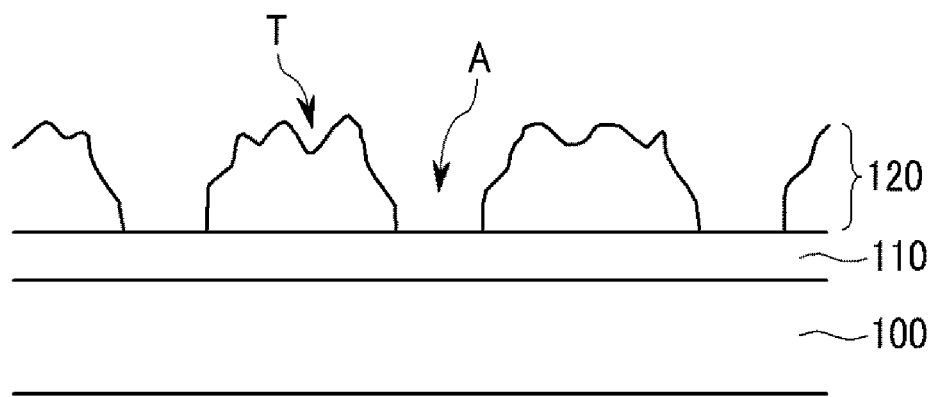

FIG. 2 and FIG. 3 are cross-sectional views of a transparent conductive layer comprising a textured surface according to an exemplary embodiment, and illustrate a manufacturing method thereof.

A method of manufacturing a transparent conductive layer according to an exemplary embodiment is shown in FIG. 2. In an embodiment, a substrate 100 is first disposed. A first and a second conductive layers 110 and 120 are then sequentially disposed onto the substrate 100 by a method comprising sputtering, or the like.

Disposing the first conductive layer 110 may comprise disposing $In_2O_3$, or the like. Specifically, an indium oxide may comprise indium tin oxide ("ITO"), indium zinc oxide ("IZO"), or the like, or a combination comprising at least one of the foregoing indium oxides. The thickness of the first conductive layer 110 may be between about 100 angstroms ("Å") to about 5000 Å, specifically about 500 Å to about 3000 Å, more specifically 1000 Å to about 2000 Å. Furthermore, the resistivity of the first conductive layer 110 may be between about $1*10^{-5}$ ohm-centimeters ("Ωcm") to about $1*10^{-3}$ Ωcm, specifically about $1*10^{-4}$ Ωcm to about $3*10^{-4}$ Ωcm, more specifically about $2*10^{-4}$ Ωcm. The first conductive layer 110 may comprise $In_2O_3$ and equal to or less than 15 weight percent ("wt. %") of at least one of $SnO_x$, $ZnO_x$, $WO_x$, $TiO_x$, and the like, and a combination comprising at least one of the foregoing oxides, based on the total weight of the first conductive layer. In an embodiment, the first conductive layer 110 may be disposed by disposing less than or equal to 15 wt. % of at least one of $SnO_x$, $ZnO_x$, $WO_x$, $TiO_x$, and the like, and a combination comprising at least one of the foregoing oxides, on $In_2O_3$, based on the total weight of the first conductive layer. When the first conductive layer comprises a combination of at least one of the foregoing oxides and $In_2O_3$, the conductivity of a first conductive layer can be increased, and a moisture or air sensitivity of the first conductive layer can be reduced.

Disposing the second conductive layer 120 may comprise disposing a ZnO-based material. The thickness of the second conductive layer 120 may be between about 100 Å to about 20,000 Å, specifically about 500 Å to about 10,000 Å, more specifically about 1000 Å to about 5000 Å. Furthermore, the resistivity of the second conductive layer 120 may be between about $1*10^{-5}$ Ωcm to about $1*10^{-3}$ Ωcm, specifically between about $2*10^{-4}$ Ωcm to about $10*10^{-4}$ Ωcm, more specifically about $4*10^{-4}$ Ωcm to about $8*10^{-4}$ Ωcm. The second conductive layer 120 may comprise ZnO and less than or equal to 10 wt. % of at least one of $AlO_x$, $GaO_x$, and the like, and a combination comprising at least one of the foregoing oxides, based on the total weight of the second conductive layer. The second conductive layer 120 may be disposed by disposing less than or equal to 10 wt. % of at least one of $AlO_x$, $GaO_x$, and the like, and a combination comprising at least one of the foregoing oxides, based on the total weight of the second conductive layer, on ZnO. When the second conductive layer comprises a combination of at least one of the foregoing oxides and a ZnO-based material, the conductivity of a second conductive layer can be increased, while a moisture or air sensitivity of the second conductive layer can be reduced.

A textured surface T is disposed at a top surface of the second conductive layer 120 by etching the second conductive layer 120. In an embodiment, the second conductive layer 120 is etched continuously, and a top surface of the first conductive layer 110 is partially exposed. Thus the second conductive layer 120 can be disposed such that it comprises an opening A, which exposes the first conductive layer 110.

In an embodiment, the first conductive layer 110 can also be etched due to over-etching after the top surface of the first conductive layer 110 is exposed. Etching of the first conductive layer can decrease the electrical conductivity of the first conductive layer 110 such that the first conductive layer 110, which can be a transparent electrode, can have a wire resistance which is less than a selected wire resistance. Therefore, it is desirable to select the etching solution used for etching the second conductive layer 120, and the materials for the first and the second conductive layers 110 and 120, such that etching of the first conductive layer is minimized or substantially eliminated.

As described above, in an embodiment ITO is disposed as the first conductive layer 110, a ZnO-based material is disposed as the second conductive layer 120, and an etching solution, which has an etching selection ratio, is used to conduct the etching. The etching solution can have an etching selection ratio of the second conductive layer 120 to the first conductive layer 110 of between about 5:1 to about 150:1, specifically about 10:1 to about 100:1, more specifically about 15:1 to about 50:1. The etching solution can comprise at least one acid selected from the group consisting of nitric acid, hydrochloric acid, sulfuric acid, acetic acid, and the like, and a combination comprising at least one of the foregoing acids.

The diameter of the top surface of the first conductive layer 110 exposed through the opening A can be between about 0.1 μm to about 10 μm, specifically about 1 μm to about 3 μm, more specifically about 2 μm. Accordingly, a feature size of the textured surface can be greater than or equal to 0.5 μm, specifically greater than or equal to 1 μm, more specifically greater than or equal to 3 μm. A feature comprising a dimension greater than or equal to 0.5 μm, specifically greater than or equal to 1 μm, more specifically greater than or equal to 3 μm is difficult to form with existing processes, and a feature comprising such a dimension can diffuse long wavelength light.

In an embodiment, disposing the second conductive layer 120 comprises disposing a ZnO-based material, wherein one portion thereof is etched entirely, and a remaining portion thereof is partially etched.

In an embodiment a ZnO-based thin film is disposed by sputtering, or the like. The ZnO-based thin film can be polycrystalline, and can comprise columns. When the etching is performed using an acidic or a basic solution, the second conductive layer can be etched anisotropically. Anisotropic etching can occur if a portion of a layer, such as a grain boundary, is etched preferentially. Therefore, when the second conductive layer 120 is etched, a cone-shaped crater can be disposed at a top surface of the second conductive layer 120, and with additional etching time the crater can be enlarged so that the top surface of the first conductive layer 110 is partially exposed through the second conductive layer 120.

Figure 4:
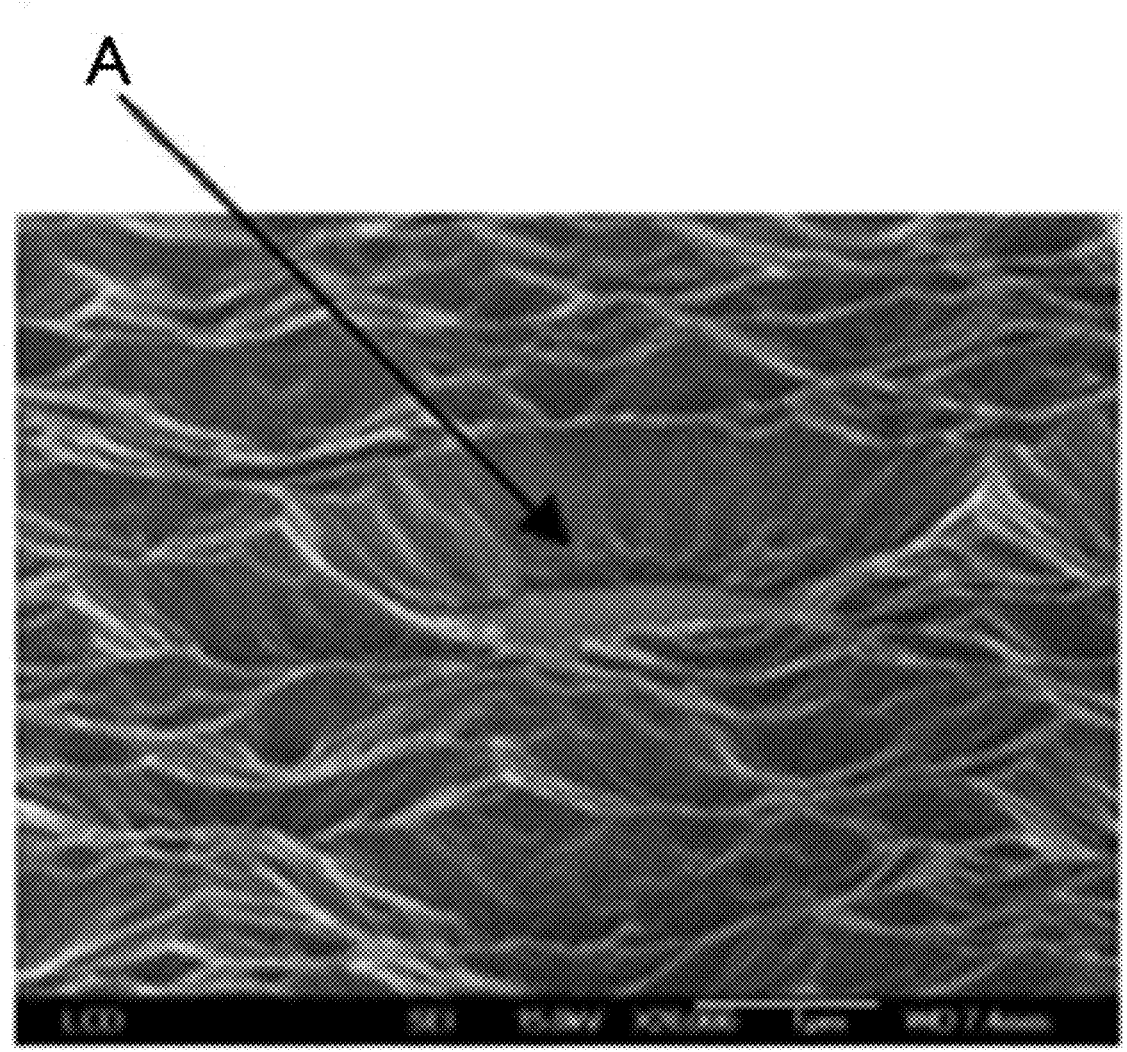
FIG. 4 is a photograph of an exemplary embodiment of a transparent conductive layer.

FIG. 4 is a photograph of a top surface of a transparent conductive layer according to an exemplary embodiment.

A transparent conductive layer comprising a textured surface can be disposed by a manufacturing method according to an exemplary embodiment, which is further described with reference to FIG. 3 and FIG. 4.

A first conductive layer 110 is disposed on a substrate 100, and a second conductive layer 120, which comprises an opening A, is disposed on the first conductive layer 110. The first conductive layer 110 is exposed through the opening A. As shown in FIG. 4, a top surface of the first conductive layer 110 may be flat. This configuration results because the etching solution, which can have an etching selection ratio of about 10:1, is used in etching the second conductive layer 120. Accordingly, the transparent conductive layer can have a selected wire resistance. A top surface of the second conductive layer 120 is textured, thus the second conductive layer 120 comprises a textured surface. The diameter of the exposed top surface of the first conductive layer 110 can be between about 0.1 µm to about 10 µm, specifically greater than or equal to about 1 µm, more specifically greater than or equal to about 3 µm. Accordingly, the textured surface can include both large and small features, thus can provide the desired light scattering effect with respect to light of both long and short wavelengths. Disposing the first conductive layer 110 can comprise disposing $In_2O_3$, and disposing the second conductive layer 120 can comprise disposing a ZnO-based material. Specifically, the first conductive layer 110 can comprise ITO, IZO, or the like, or a combination comprising at least one of the foregoing transparent oxides. The thickness of the first conductive layer 110 can be between about 100 Å to about 5000 Å, specifically between about 500 Å to about 3000 Å, more specifically between about 1000 Å to about 2000 Å, and the thickness of the second conductive layer 120 can be between about 100 Å to about 20,000 Å, specifically between about 500 Å to about 10,000 Å, more specifically between about 1000 Å to about 5000 Å.

Figure 5A:
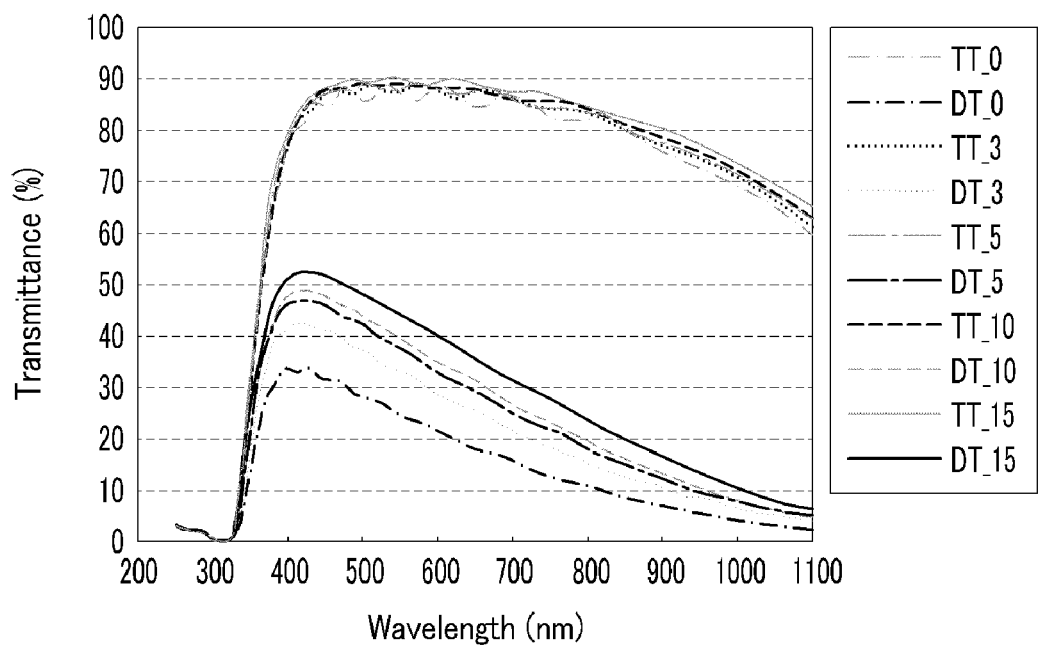
FIG. 5A is a graph illustrating variation in a transmittance of a commercially available transparent conductive layer as an etching time thereof is increased.
Figure 5B:
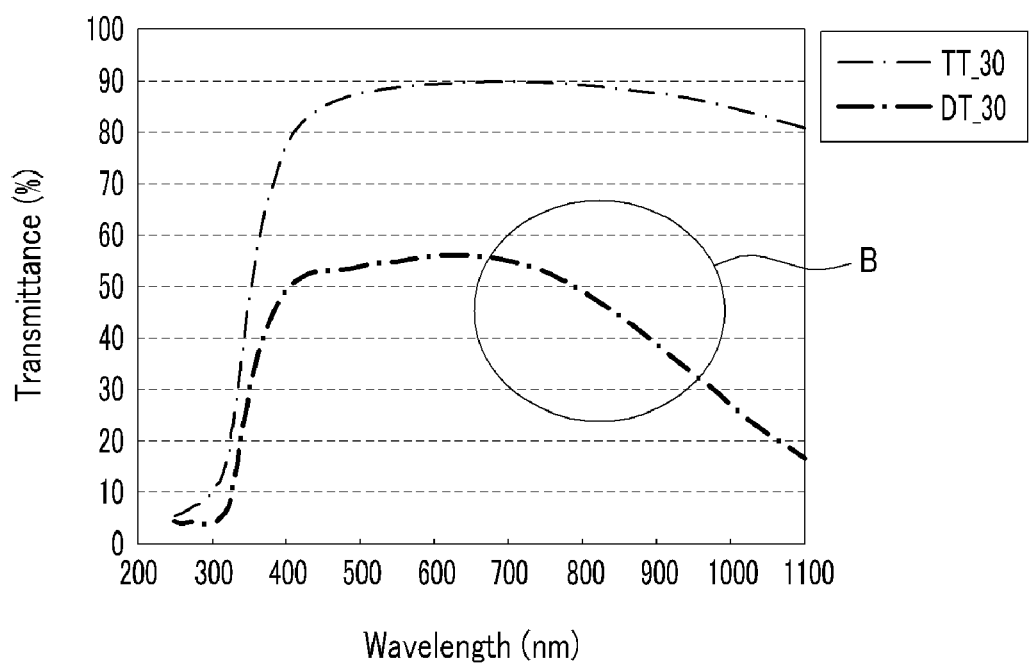
FIG. 5B is a graph illustrating a transmittance of an exemplary embodiment of a transparent conductive layer as a function of the wavelength.

FIG. 5A is a graph illustrating variation in a transmittance of a commercially available transparent conductive layer as the etching time thereof is increased, and FIG. 5B is a graph illustrating a transmittance of an exemplary embodiment of a transparent conductive layer as a function of the wavelength.

Referring to FIG. 5A, TT indicates a total transmittance, and DT indicates a diffuse transmittance. Increasing the etching time of a commercially available ZnO-based single layer structure can increase the diffuse transmittance in the long wavelength region. However, as shown in FIG. 5A, when the etching time is increased, the transmittance in the long wavelength region cannot be improved. Furthermore, etching a ZnO-based single layer structure can expose a bottom of the single layer structure so that a sheet resistance may be increased.

By contrast, a diffuse transmittance DT of a transparent conductive layer comprising a textured surface can be increased in a long wavelength region B, as shown in FIG. 5B. Accordingly, in a thin film solar cell comprising a light-absorbing layer in which it is desirable to absorb light of long wavelengths, such as light having a wavelength of equal to or greater than 600 nm, the scattering of long wavelength light can be increased so that a light conversion efficiency of the solar cell is improved. Furthermore, because the transparent conductive layer can comprise a non-etched first conductive layer based on $In_2O_3$, the transparent conductive layer can have a selected sheet resistance.

Figure 6:
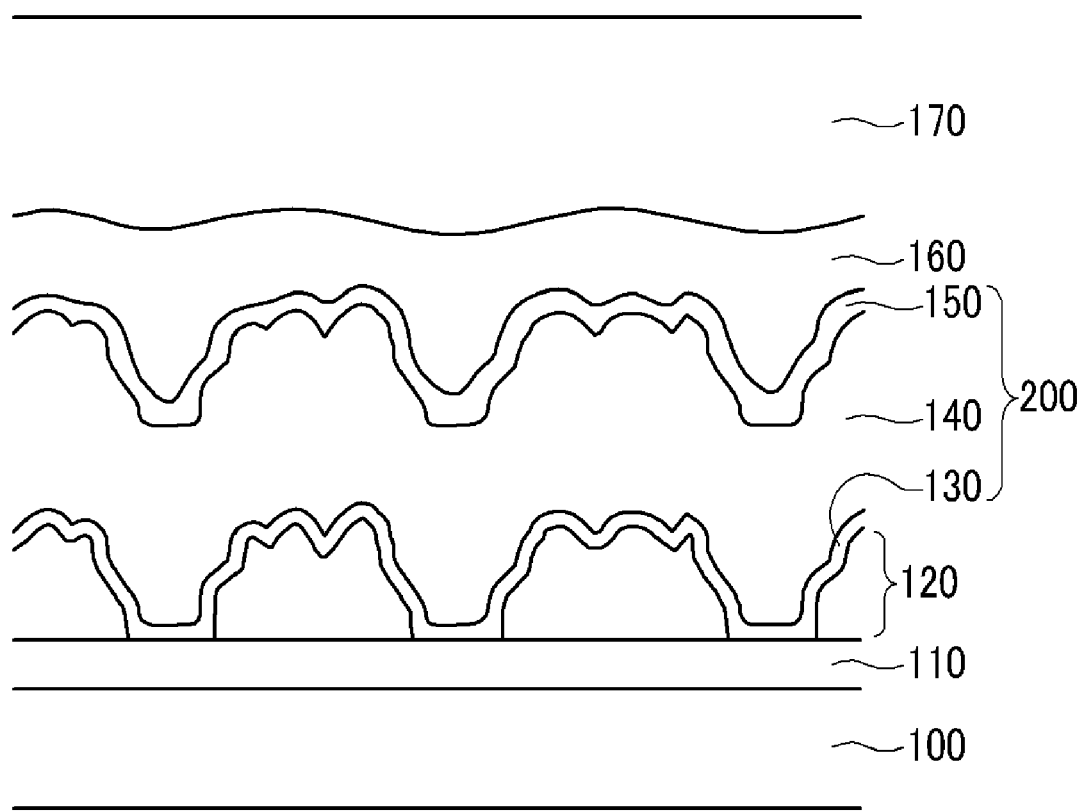
FIG. 6 is a cross-sectional view of an exemplary embodiment of a photoelectric device.

FIG. 6 is a cross-sectional view of a photoelectric device according to another exemplary embodiment.

A solar cell comprising a transparent conductive layer according to an exemplary embodiment is explained with reference to FIG. 6.

A solar cell according to an exemplary embodiment includes a transparent conductive layer disposed on a substrate 100. As described above, the transparent conductive layer comprises a first conductive layer 110, which comprises an indium oxide, and a second conductive layer 120, which comprises a ZnO-based material, sequentially disposed on the substrate 100. Specifically, the indium oxide may comprise ITO, IZO, or the like, or a combination comprising at least one of the foregoing indium oxides. The second conductive layer 120 is disposed on the first conductive layer 110 such that a top surface of the first conductive layer 110 is partially exposed. The disposing of the second conductive layer 120 may comprise etching with an etching solution having an etching selection ratio of the second conductive layer 120 to the first conductive layer 110 of equal to or greater than about 5:1, specifically equal to or greater than about 10:1, more specifically equal to or greater than about 50:1.

A semiconductor layer 200 is disposed on the transparent conductive layer, which comprises the first and the second conductive layers 110 and 120. The semiconductor layer 200 includes a P layer 130, an I layer 140, and an N layer 150 sequentially disposed on the transparent conductive layer. The disposing of the P layer 130, the I layer 140, and the N layer 150 may comprise a method including plasma chemical vapor deposition ("PECVD"). A rear conductive layer 160 can be disposed on the N layer 150. A reflective electrode layer 170 can be disposed on the rear conductive layer 160.

The semiconductor layer 200 may comprise a multi-layered structure comprising a plurality of sub-structures, each of which comprises a P layer 130, an I layer 140, an the N layer 150, which are sequentially disposed. In an embodiment, the multi-layered structure may comprise a tandem structure where the layers are sequentially disposed in the order PIN/PIN, or the multi-layered structure may comprise a triple-junction structure where the layers are sequentially disposed in the order PIN/PIN/PIN, or the multi-layered structure may comprise a multi-junction structure. In an embodiment, the semiconductor layer 200 has a multi-layered structure, which has a broadened light-absorbing region.

In a tandem structure, a lower-region I layer may comprise amorphous silicon ("a-Si"), and an upper-region I layer may comprise micro-crystalline silicon ("µc-Si"). Because a light absorption coefficient of µc-Si is significantly lower than that of a-Si, scattering of long wavelength light improves a light efficiency. Accordingly, in a solar cell according to an exemplary embodiment, the light efficiency can be enhanced, relative to a light efficiency of a thin film solar cell with a light-absorbing layer. Thus light absorption of long wavelengths is desirable, as is the case with the above described tandem structure.

While this disclosure describes exemplary embodiments, it is to be understood that the invention is not limited to the disclosed embodiments. It will be also be understood by those skilled in the art that various changes can be made and equivalents can be substituted for elements thereof without departing from the scope of the disclosed embodiments. In addition, many modifications can be made to adapt a particular situation or material to the teachings of this disclosure without departing from the essential scope thereof. Thus various modifications and equivalent arrangements are included within the spirit and scope of this disclosure.

What is claimed is:

1. A transparent conductive layer comprising:
a substrate;
a first conductive layer disposed on the substrate; and a second conductive layer disposed on the first conductive layer, wherein the second conductive layer comprises a textured surface and an opening which exposes the first conductive layer, wherein the opening comprises a diameter between about 1 micrometer to about 3 micrometers.

2. The transparent conductive layer of claim 1, wherein the first conductive layer is formed with $In_2O_3$, and the second conductive layer is formed with a ZnO-based material.

3. The transparent conductive layer of claim 2, wherein the first conductive layer is formed with $In_2O_3$ and equal to or less than 15 weight percent of at least one of $SnO_x$, $ZnO_x$, $WO_x$, $TiO_x$, and a combination comprising at least one of the foregoing oxides, based on the total weight of the first conductive layer.

4. The transparent conductive layer of claim 2, wherein the second conductive layer is formed with ZnO and equal to or less than 10 weight percent of at least one of $AlO_x$, $GaO_x$, and a combination comprising at least one of the foregoing oxides, based on the total weight of the second conductive layer.

5. The transparent conductive layer of claim 1, wherein the first conductive layer comprises a thickness between about 500 angstroms to about 3000 angstroms.

6. The transparent conductive layer of claim 1, wherein the second conductive layer comprises a thickness between about 500 angstroms to about 10,000 angstroms.

7. A photoelectric device comprising:

a substrate;

a first conductive layer disposed on the substrate;

a second conductive layer disposed on the first conductive layer, wherein the second conductive layer comprises an opening which exposes the first conductive layer;

a semiconductor layer disposed on the second conductive layer; and a rear electrode disposed on the semiconductor layer, wherein a top surface of the second conductive layer comprises a textured surface, and the opening comprises a diameter between about 1 micrometer to about 3 micrometers.

8. The photoelectric device of claim 7, wherein the first conductive layer is formed with disposing $In_2O_3$, and the second conductive layer is formed with a ZnO-based material.

9. The photoelectric device of claim 8, wherein the semiconductor layer comprises a lower layer and an upper layer, wherein the lower layer comprises a P layer, an I layer, and an N layer which are sequentially disposed on the second conductive layer, wherein the upper layer comprises a P layer, an I layer, and an N layer which are sequentially disposed on the lower layer, wherein the I layer of the lower layer is formed with amorphous silicon, and the I layer of the upper layer is formed with micro-crystalline silicon.

10. The photoelectric device of claim 7, wherein the semiconductor layer comprises a multi-layered structure comprising a plurality of sub-structures, wherein each sub-structure comprises a P layer, an I layer, and an N layer which are sequentially disposed.

11. The photoelectric device of claim 7, wherein the semiconductor layer comprises a P layer, an I layer, and an N layer, which are sequentially disposed on the second conductive layer.

\* \* \* \* \*